United States Patent
Takahashi et al.

(10) Patent No.: US 9,154,082 B2
(45) Date of Patent: Oct. 6, 2015

(54) INPUT SIGNAL AMPLIFIER

(71) Applicant: Panasonic Corporation, Osaka (JP)

(72) Inventors: Kouji Takahashi, Shiga (JP); Makoto Ohba, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/606,638

(22) Filed: Jan. 27, 2015

(65) Prior Publication Data

US 2015/0222232 A1  Aug. 6, 2015

(30) Foreign Application Priority Data

Feb. 4, 2014  (JP) .................................. 2014-019205

(51) Int. Cl.
*H04B 1/401* (2015.01)
*H03F 1/02* (2006.01)
*H03B 5/36* (2006.01)

(52) U.S. Cl.
CPC ................ *H03F 1/0205* (2013.01); *H03B 5/36* (2013.01); *H04B 1/401* (2013.01); *H03F 2200/129* (2013.01)

(58) Field of Classification Search
CPC .................... H03F 2200/129; H03F 2200/135; H03F 2200/151; H03F 2200/153; H03F 2200/156; H03F 2200/159; H03F 2203/30031; H03F 2203/30036; H03F 2203/45116; H03F 2203/45118; H03F 2203/45336; H03F 2203/45601; H03F 2203/45602; H03F 1/30; H03F 1/303; H03F 1/304; H03F 1/305
See application file for complete search history.

(56) References Cited

U.S. PATENT DOCUMENTS

| | | | | |
|---|---|---|---|---|
| 5,764,112 A | * | 6/1998 | Bal et al. ................. | 331/116 FE |
| 6,073,149 A | * | 6/2000 | Shou et al. ........................ | 708/3 |
| 2002/0037032 A1 | * | 3/2002 | Nakamura et al. ............ | 375/222 |
| 2007/0170974 A1 | * | 7/2007 | Saman et al. ................. | 327/363 |
| 2008/0246667 A1 | * | 10/2008 | Symons ........................ | 343/702 |
| 2010/0052792 A1 | * | 3/2010 | Nose et al. .................... | 330/295 |
| 2010/0330941 A1 | * | 12/2010 | Trikha et al. ............... | 455/180.1 |
| 2011/0291766 A1 | * | 12/2011 | Mashimo et al. ............. | 330/308 |
| 2012/0200440 A1 | * | 8/2012 | Okada et al. .................. | 341/143 |

FOREIGN PATENT DOCUMENTS

JP  2007-036486  2/2007

* cited by examiner

*Primary Examiner* — Siu Lee
(74) *Attorney, Agent, or Firm* — Greenblum & Bernstein P.L.C.

(57) ABSTRACT

An input signal amplifier includes an inverting amplifier that outputs an input signal, a logic of which is inverted; a first switch, that switches an input, terminal of the inverting amplifier to be grounded or not; and a feedback resistor connected in parallel with the inverting amplifier and including a plurality of resistors with different values of resistance. The feedback resistor includes both a second switch that shorts or opens the feedback resistor via at least one of the resistors and a third switch that shorts or opens the feedback resistor via another of the resistors.

11 Claims, 7 Drawing Sheets

| STATE / SW NAME | CIRCUIT OFF | QUICK START-UP | CIRCUIT ON |
|---|---|---|---|
| SW1 | ON | OFF | OFF |
| SW2 | OFF | ON | ON |
| SW3 | OFF | ON | OFF |

FIG. 6

| STATE / SW NAME | CIRCUIT OFF | QUICK START-UP | CIRCUIT ON |
|---|---|---|---|
| SW1 | ON | OFF | OFF |
| SW2 | OFF | OFF | ON |
| SW3 | OFF | ON | OFF |

FIG. 8

INPUT SIGNAL AMPLIFIER

CROSS REFERENCES TO RELATED APPLICATIONS

This application claims priority to Japanese Patent Application No. 2014-019205, filed on Feb. 4, 2014, the contents of which are hereby incorporated by reference.

BACKGROUND

1. Technical Field

The present disclosure relates to an input signal amplifier.

2. Description of the Related Art

Figure 1A:
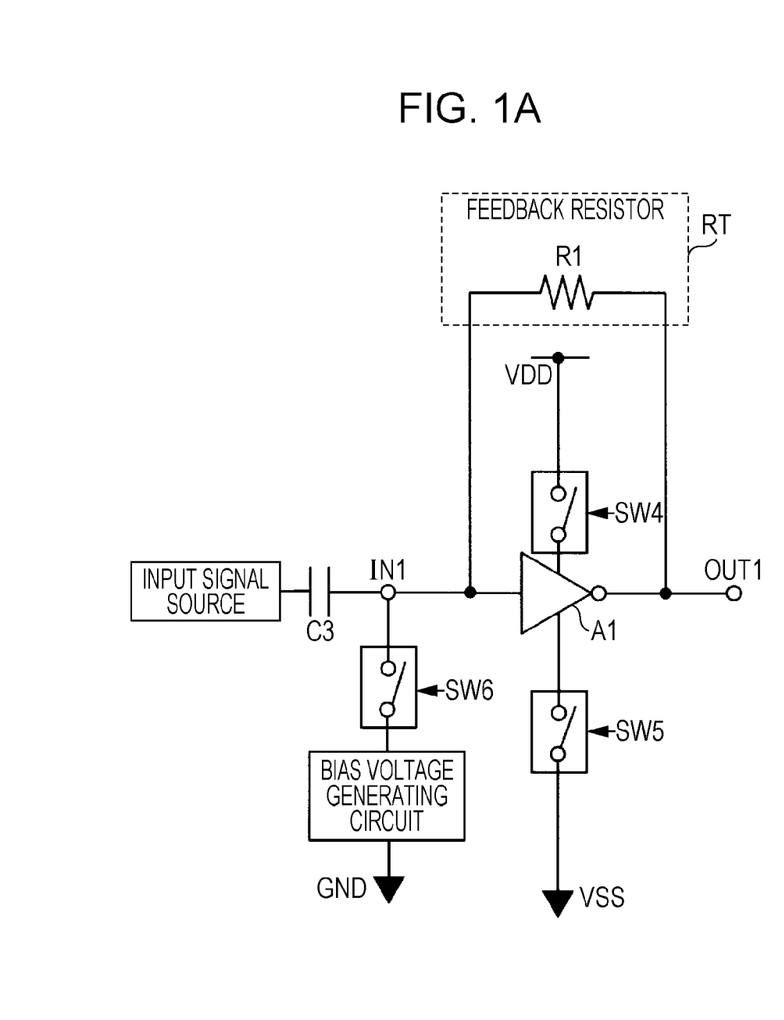
FIGS. 1A and 1B illustrate a configuration of an input amplifier disclosed in Japanese Patent No. 4625732.
Figure 1B:
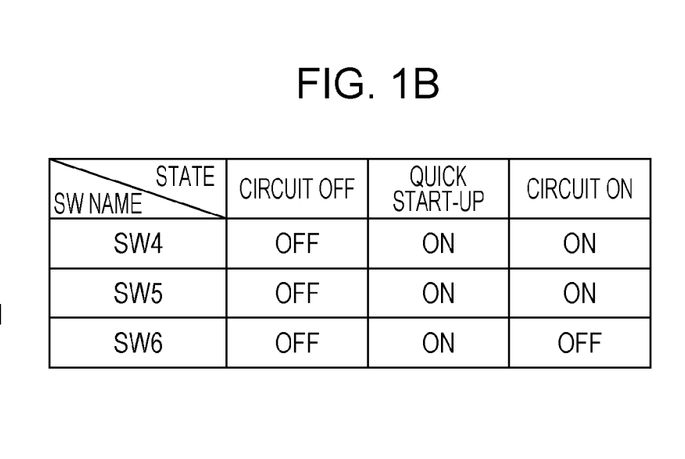

In. an input amplifier disclosed in Japanese Patent No. 4625732, as illustrated in FIG. 1A, a bias voltage generating circuit for quick start-up and a pre-charge switch SW6 are added to an input IN1 of an inverting amplifier A1 to enable an input voltage of the inverting amplifier A1 to quickly start up. In the input amplifier in FIG. 1A, on/off states of switches SW4 to SW6 are controlled in accordance with the state of the circuit as indicated in an on/off control logic table in FIG. 1B.

SUMMARY

In the input amplifying circuit disclosed in Japanese Patent No. 4625732, the input voltage of the inverting amplifier can quickly start up when the state of the circuit is switched from an off state to an on state. However, in the input amplifying circuit disclosed in Japanese Patent No. 4625732, power consumption and circuit scale may increase in the bias voltage generating circuit for quick start-up.

Thus, a non-limiting and exemplary embodiment of the present disclosure provides an. input signal amplifier capable of quick start-up of the input voltage without causing increase in circuit scale and power consumption.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

In one general aspect, the techniques disclosed here feature: an input, signal amplifier including an inverting amplifier that outputs an input signal, a logic of which is inverted; a first switch that switches an input terminal of the inverting amplifier to be grounded or not; and a feedback resistor connected in parallel with the inverting amplifier and including a plurality of resistors with different values of resistance. The feedback resistor includes both a second switch that shorts or opens the feedback resistor via at least one of the resistors and a third switch that shorts or opens the feedback resistor via another of the resistors.

These general and specific aspects may be implemented using a device, a system, a method, and a computer program, and any combination of devices, systems, methods, and computer programs.

According to the one general aspect, the input voltage can quickly start up without causing increase in circuit scale and power consumption.

DETAILED DESCRIPTION

Embodiments of the present disclosure will be described below in detail with reference to the drawings. In the embodiments, the same reference characters are assigned to the components having the same function and duplicated descriptions will be omitted.

(Embodiment 1)

Figure 2:
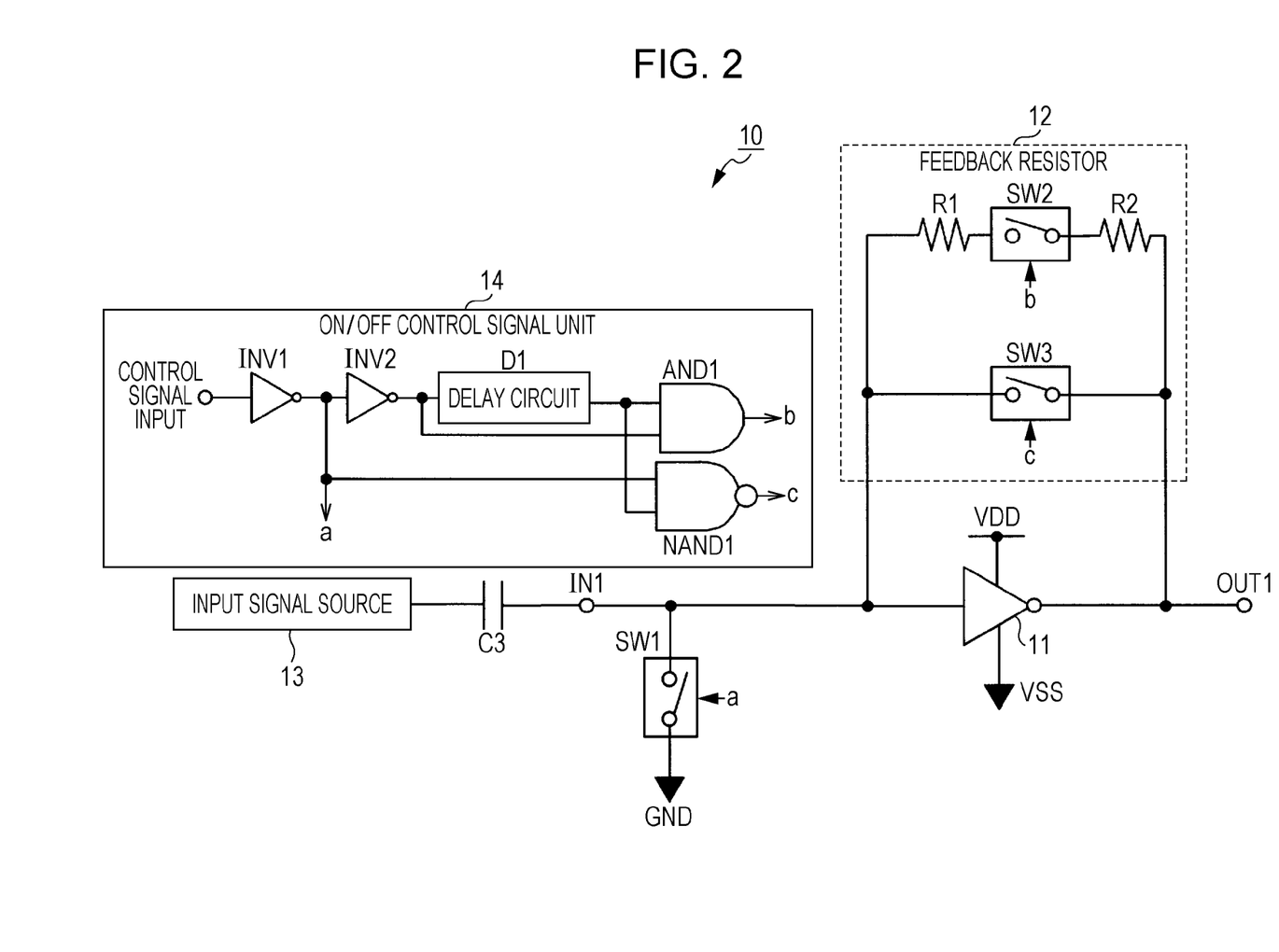
FIG. 2 illustrates a configuration. of an input signal amplifier according to Embodiment 1 of the present disclosure.

FIG. 2 illustrates a configuration of an input signal amplifier 10 according no Embodiment 1 of the present disclosure. The configuration of the input signal amplifier 10 will be described below using FIG. 2.

Figure 3:
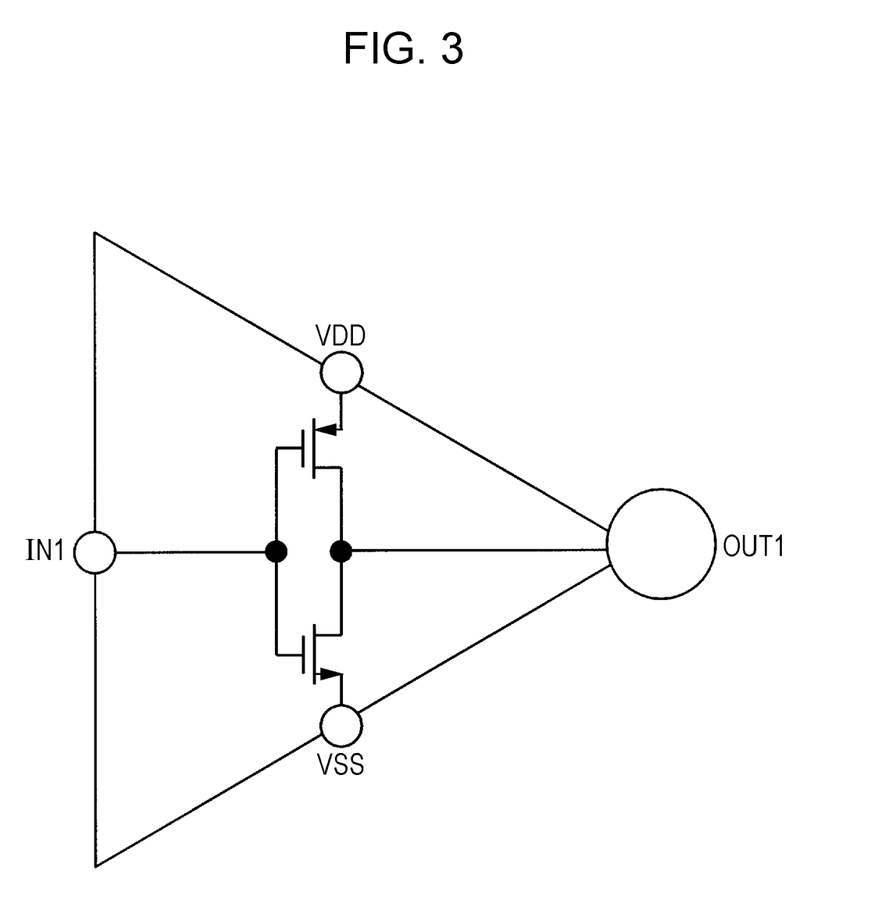
FIG. 3 illustrates an internal configuration of an inverting amplifier illustrated in FIG. 2.
Figure 4:
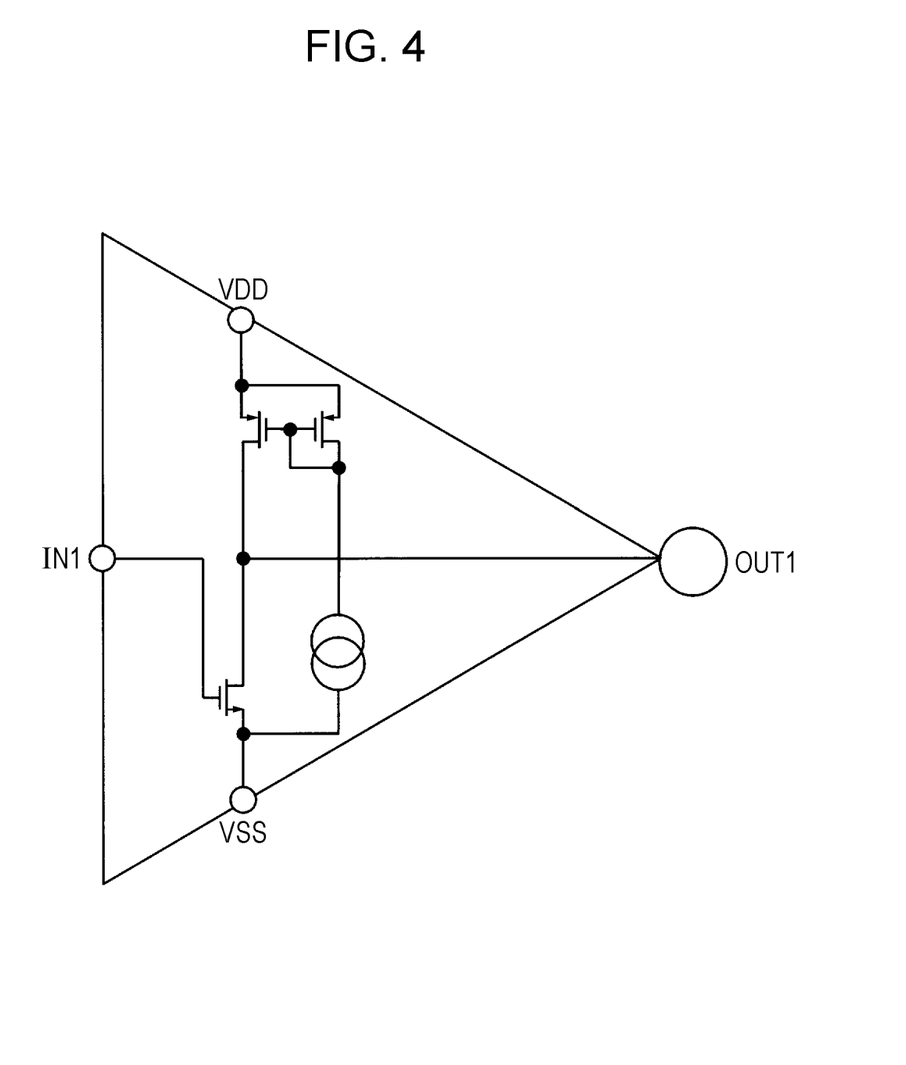
FIG. 4 illustrates an internal configuration of the inverting amplifier illustrated in FIG. 2.

Any amplifier may be used for an inverting amplifier 11 as long as an input and an output are logically inverted. Examples of such an amplifier include ones of an inverter type illustrated in FIG. 3 and of an N-channel constant current injection type illustrated in FIG. 4. A switch (SW) for a constant current source or intermittent operation may be added to a portion between a VDD terminal of the inverting amplifier 11 and a power supply in which VDD is supplied and a portion between a VSS terminal of the inverting amplifier 11 and GND.

A feedback resistor 12 is connected between an output terminal OUT1 and an input terminal IN1 of the inverting amplifier 11. The feedback resistor 12 has a plurality of resistance values including a value of high resistance obtained by connecting in series a resistor R1 (corresponding to a first resistor) and a switch SW2 and a resistor P2 (corresponding to a second resistor) and a value of low resistance obtained by connecting a switch SW3.

A switch SW1 is added in order to reduce standby power in an off state of a circuit of the inverting amplifier 11. In the off state, the input terminal IN1 of the inverting amplifier 11 is pulled down to the GND or pulled up to the VDD (FIG. 2 illustrates a configuration of the input terminal IN1 pulled down to the VSS).

Typically, a MOS transistor-type or a transfer gate-type switch is used for the switches SW1 to SW3. The switch SW2 is connected between the resistor R1 and the resistor R2. During AC operation of the input signal amplifier 10, an internal on-resistance of the switch SW2 less changes when both terminals of the switch SW2 undergo a small potential change and therefore degradation in phase noise of an AC signal can be alleviated. Accordingly, the resistance values of the resistors R1 and R2 are made equal, for example.

An input signal source 13, which is a reference signal source represented by a temperature compensated crystal oscillator (TCXO), is connected. to the input terminal IN1 of the inverting amplifier 11 through. an AC coupling capacitor C3.

The on/off control of the switches SW1 to SW3 is implemented by a signal generated in an on/off control signal unit 14. The on/off control signal unit 14 is constituted by inverters INV1 and INV2, a delay circuit D1, AND1, and NAND1.

Any configuration may be adopted for the delay circuit D1 as long as the delay time period corresponds to a period for quick start-up of the input signal amplifier 10 and a certain delay time is provided. Typically, the delay circuit D1 includes an RC delay circuit composed of a resistor and a capacitor, a delay circuit composed of a multiple-stage inverter, or a combination thereof.

The on/off control signal unit 14 is a circuit that is on when the control signal input is "H" and is off when the control signal input is "L". The switches SW1 to SW3 are on when respective control signal nodes a, b, and c are "H" and off when the nodes a, b, and c are "L".

An operation of the input signal amplifier 10 illustrated in FIG. 2 will be described using an on/off control, logic table in FIG. 5.

When the input signal amplifier 10 is in the off state, an on signal for the switch SW1 is output from "a" in the on/off control signal unit 14 and off signals for the switch SW2 and the switch SW3 are respectively output from "b" and "c" in the on/off control signal unit 14. As a result, the states of the switches SW2 and SW3 turn into off and the feedback resistor 12 is opened, thereby causing an inverter operation of the inverting amplifier 11. In this state, the switch SW1 is in the on state and pulled down to the GND. Accordingly, no current consumption occurs unless leak current is generated during the off state of a transistor constituting the circuit.

When the circuit state of the input, signal amplifier 10 switches from off to quick start-up, an off signal for the switch SW1 is output from "a" in the on/off control signal unit 14 and on signals for the switch SW2 and the switch SW3 are respectively output from "b" and "c". As a result, the states of the switches SW2 and SW3 turn into on, the resistance value of the feedback resistor 12 comes into low, the switch SW1 is opened, and then the inverting amplifier 11 receives feedback through the resistors with a low value of resistance in the feedback resistor 12. As a consequence, the voltage of the input terminal IN1 quickly starts up. In this case, quick start-up of the input voltage can be achieved without consuming additional current, because no bias voltage generating circuit or the like for quick start-up is used. This period for quick start-up is determined by the delay time of the delay circuit D1.

When the input signal amplifier 10 is in the on state, an off signal for the switch SW1 is output from "a" in the on/off control signal unit 14, an on signal for the switch SW2 is output from "b", and an off signal for the switch SW3 is output. from "c". As a result, the state of the switch SW3 turns into off from quick start-up, the resistance value of the feedback resistor 12 comes into high, and consequently, the input signal amplifier 10 operates with high gain. The input signal amplifier 10 repeats the off-circuit state, quick start-up, and the on-circuit state, thereby achieving the input signal amplifier capable of quick start-up and suitable for intermittent operation with low power consumption.

Figure 7A:
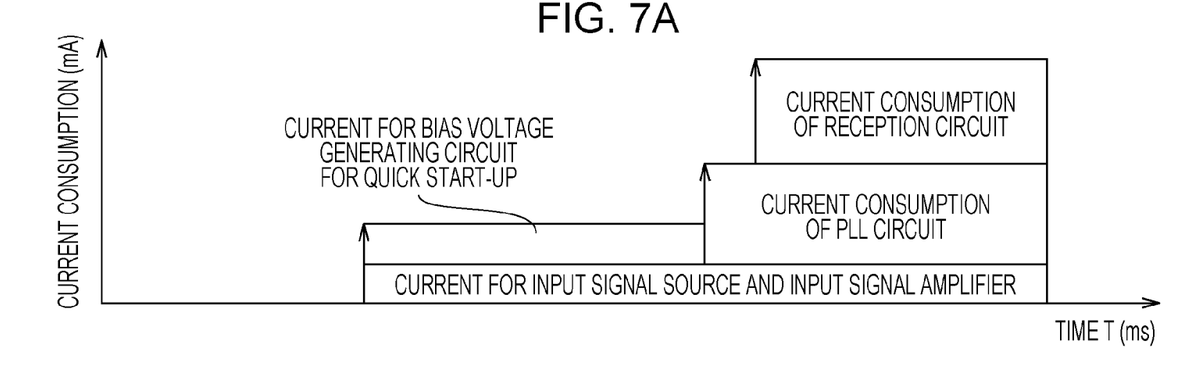
FIGS. 7A and 7B illustrate changes in current consumption in intermittent reception by a wireless communication device equipped with the input signal amplifier illustrated in FIG. 2.
Figure 7B:
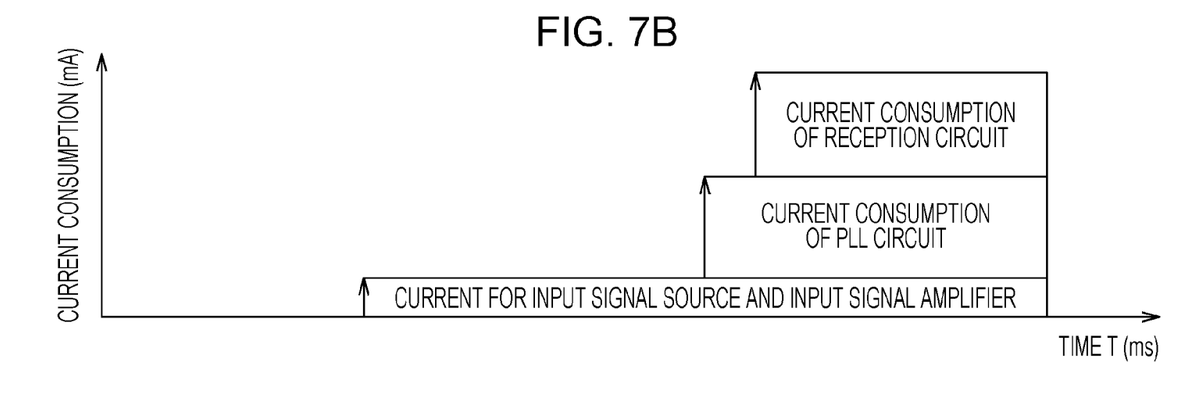

Changes in current consumption in intermittent reception by a wireless communication device equipped with the input signal amplifier 10 illustrated in FIG. 2 will be described using FIGS. 7A and 7B. FIG. 7A illustrates changes in current consumption when the related-art input amplifier illustrated in FIG. 1 is used, while FIG. 7B illustrates changes in current consumption when the input signal amplifier 10 illustrated in FIG. 2 is used. As can be seen from FIGS. 7A and 7B, in FIG. 7B, the current of the bias voltage generating circuit for quick start-up is able to be reduced as compared to the case of FIG. 7A.

As described above, the input signal amplifier according to Embodiment 1 includes the switch SW1 that switches the input signal of the inverting amplifier between being grounded and not grounded and the feedback resistor connected in parallel with the inverting amplifier and including a plurality of resistors with different values of resistance. The feedback resistor includes both the switch SW2 that shorts or opens the feedback resistor via one of the resistors and the switch SW3 that shorts or ovens the feedback resistor via another of the resistors. The on/off control signal unit appropriately switches the on/off states of the switches SW1 to SW3 in accordance with the state of the circuit. Consequently, the resistance values of the feedback resistor are low at the time of quick start-up while the switch SW1 is opened to quickly start up the input voltage of the inverting amplifier without causing increase in circuit scale and power consumption.

The feedback resistor 12 of the present embodiment may include, a plurality of resistors with different values of resistance in parallel. The on/off control signal unit 14 may be a circuit other than the circuit illustrated in FIG. 2 as long as the circuit is a logic circuit that, satisfies the states corresponding to the on/off control logic table illustrated in FIG. 5 or FIG. 6.

Figure 5:
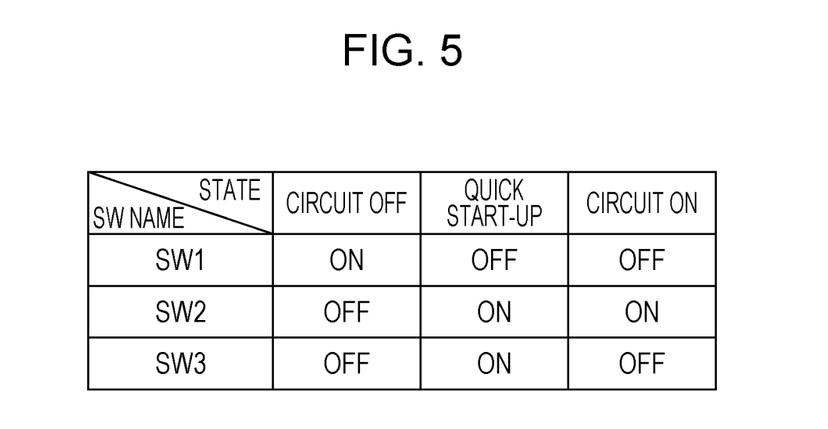
FIG. 5 illustrates an on/off control logic table.
Figure 6:
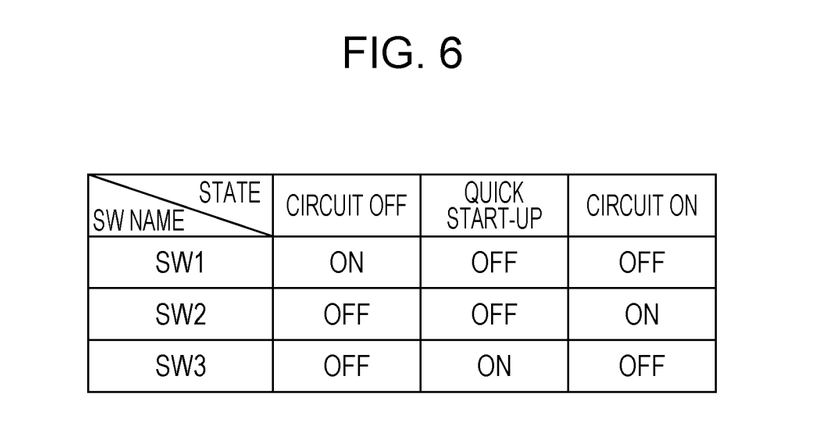
FIG. 6 illustrates another on/off control logic table.

A difference of the on/off control logic tables in FIG. 5 and FIG. 6 is that the switch SW2 is in the off state at the time of quick start-up in FIG. 6. At the time of quick start-up, the switch SW3 turns into the on state and the value of resistance between the input terminal IN1 and the output terminal OUT1 of the inverting amplifier 11 is sufficiently low, so that the state of the switch SW2 may be off.

(Embodiment 2)

Figure 8:
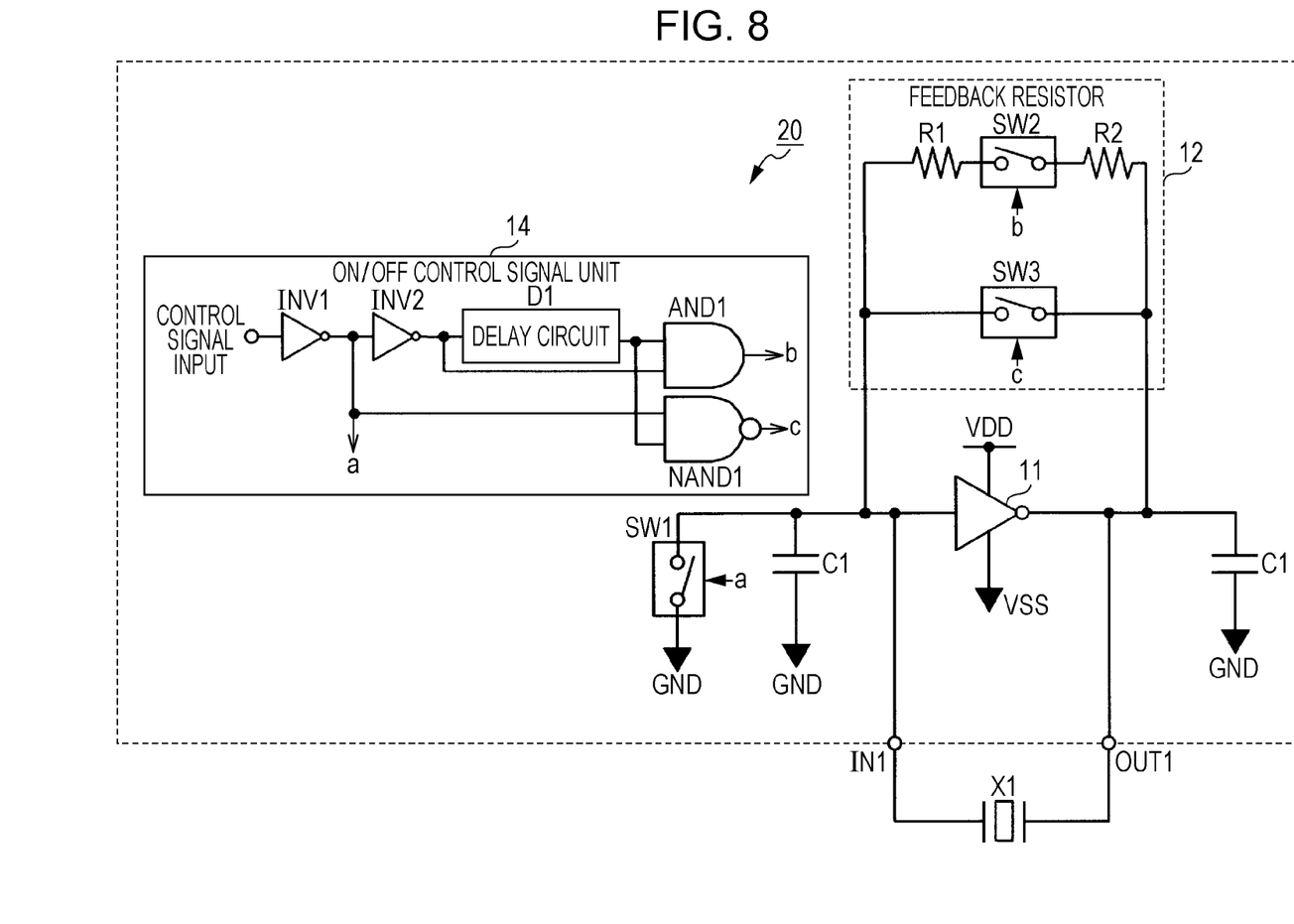
FIG. 8 illustrates a configuration of a crystal oscillator according to Embodiment 2 of the present disclosure.

FIG. 8 illustrates a configuration of a crystal oscillator 20 according to Embodiment 2 of the present disclosure. The configuration of the crystal oscillator 20 will be described below using FIG. 8.

Typically, a MOS transistor-type or a transfer gate-type switch is used for the switches SW1 to SW3. The switch SW2 is connected between the resistor R1 and the resistor R2. During oscillation of the crystal oscillator 20, an internal on-resistance of the switch SW2 less changes when both terminals of the switch SW2 undergo a small potential change and therefore degradation in phase noise of an oscillation signal can be alleviated. Accordingly, the resistance values of the resistors R1 and R2 are desirably equal to each other.

A. crystal oscillator element X1 is connected. between the input terminal IN1 and the output terminal OUT1 of the inverting amplifier 11. Load capacitors C1 corresponding to an oscillating frequency of the crystal oscillator 20 are connected between the input terminal IN1 and the GND and between the output terminal OUT1 and the GND. The components within the dashed line in FIG. 3 constitute an integrated circuit, in general. The crystal oscillator element X1 is externally connected between. the input terminal IN1 and the output terminal OUT1 in the integrated circuit.

An operation of the crystal oscillator 20 illustrated in FIG. 8 will be described using the on/off control logic table of FIG. 5.

When the crystal oscillator 20 is in the off state, an on signal for the switch SW1 is output from "a" in the on/off control signal unit 14 and off signals for the switch SW2 and the switch SW3 are respectively output from "b" and "c" in the on/off control signal unit 14. As a result, the states of the switches SW2 and SW3 turn into off and the feedback resistor 12 is opened, thereby causing an inverter operation of the inverting amplifier 11. In this state, the switch SW1 is in the on state and pulled down to the GND. Accordingly, no current consumption occurs unless leak current is generated during the off state of a transistor constituting the circuit.

When the circuit state of the crystal oscillator 20 switches from off to quick start-up, an off signal for the switch SW1 is output from "a" in the on/off control signal unit 14 and on signals for the switch SW2 and the switch SW3 are respectively output from "b" and "c". As a result, the states of the switches SW2 and SW3 turn into on, the resistance value of the feedback resistor 12 comes into low, the switch SW1 is opened, and then the inverting amplifier 11 receives feedback through the resistors with a low value of resistance in the feedback resistor 12. As a consequence, the voltage of the input terminal IN1 quickly starts up. In this case, the input voltage of the inverting amplifier 11 can quickly start up without consuming additional current, because no bias voltage generating circuit or the like for quick start-up is used. This period for quick start-up is determined by the delay time of the delay circuit D1.

When the crystal oscillator 20 is in the on state, an off signal for the switch SW1 is output from "a" in the on/off control signal unit 14, an on signal for the switch SW2 is output from "b", and an off signal for the switch SW3 is output from "c". As a result, the state of the switch SW3 turns into off from quick start-up, the resistance value of the feedback resistor 12 comes into high, and consequently, the crystal oscillator 20 operates with high gain. The crystal oscillator 20 repeats the off-circuit state, quick start-up, and the on-circuit state, thereby achieving the crystal oscillator capable of quick start-up and suitable for intermittent operation with low power consumption.

As described above, the crystal oscillator according to Embodiment 2 includes the switch SW1 that switches the input signal of the inverting amplifier between being grounded and not grounded and the feedback resistor connected in parallel, with the inverting amplifier and including a plurality of resistors with different values of resistance. The feedback resistor includes both the switch SW2 that shorts or opens the feedback resistor via one of the resistors and the switch SW3 that shorts or opens the feedback resistor via another of the resistors. The on/off control signal unit appropriately switches the on/off states of the switches SW1 to SW3 in accordance with the state of the circuit. Consequently, the resistance values of the feedback resistor is low at the time of quick start-up while the switch SW1 is opened to quickly start up the input voltage of the inverting amplifier without causing increase in circuit scale and power consumption.

The feedback resistor 12 of the present embodiment may include a plurality of resistors with different values of resistance in parallel. The on/off control signal unit 14 may be a circuit other than the circuit illustrated in FIG. 8 as long as the circuit is a logic circuit satisfying the states corresponding to the on/off control logic table in FIG. 5 or FIG. 6.

The input signal amplifier according to the present disclosure can be applied to a crystal oscillator, a semiconductor integrated circuit, a wireless communication device, an electronic apparatus, and the like.

What is claimed is:

1. An input signal amplifier. comprising:
an inverting amplifier that outputs an input signal, a logic of which is inverted;
a first switch that switches an input terminal of the inverting amplifier between being grounded and not grounded; and
a feedback resistor connected in parallel with the inverting amplifier and including a first value of resistance and a second value of resistance that is lower than the first value of resistance,
wherein the feedback resistor includes both a second switch that allows the feedback resistor to have the first value of resistance and a third switch that allows the feedback resistor to have the second value of resistance, and
wherein when a state of the input signal amplifier switches from off to on, the first switch is controlled to have the input terminal of the inverting amplifier be not grounded, and the third switch is controlled to have the feedback resister have the second value of resistance for a predetermined period of time.

2. The input signal amplifier according to claim 1 further comprising:
an on/off controller that controls the first to the third switches to be in an on state or an off state in accordance with the state of the input signal amplifier.

3. The input signal amplifier according to claim 2, wherein, when the state of the input signal amplifier is in an off state, a quick start-up state, or an on state, the first to the third switches are controlled by a single control signal input of the on/off controller.

4. The input, signal amplifier according to claim 1, wherein the second switch is connected in series between a first resistor and a second resistor.

5. The input signal amplifier according to claim 4, wherein values of resistance of the first resistor and the second resistor are equal to each other.

6. The input, signal amplifier according to claim 1, wherein the inverting amplifier is an inverter type amplifier.

7. The input signal amplifier according to claim 1, wherein the inverting amplifier is an N-channel constant current injection type amplifier.

8. A crystal oscillator comprising the input signal amplifier according to claim 1.

9. A semiconductor integrated circuit comprising the input signal amplifier according to claim 1.

10. A wireless communication device comprising the input signal amplifier according to claim 1.

11. An electronic apparatus comprising the input signal amplifier according to claim 1.

* * * * *